US011021804B2

(12) United States Patent
Takai et al.

(10) Patent No.: US 11,021,804 B2
(45) Date of Patent: Jun. 1, 2021

(54) PLATING SOLUTION AND METAL COMPOSITE AND METHOD OF MANUFACTURING THE SAME

(71) Applicant: SAMSUNG ELECTRONICS CO., LTD., Suwon-si (KR)

(72) Inventors: Kenji Takai, Hwaseong-si (KR); Sang Eui Lee, Hwaseong-si (KR); Daiki Minami, Suwon-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 6 days.

(21) Appl. No.: 16/176,332

(22) Filed: Oct. 31, 2018

(65) Prior Publication Data

US 2019/0233961 A1 Aug. 1, 2019

(30) Foreign Application Priority Data

Jan. 26, 2018 (KR) ........................ 10-2018-0009925

(51) Int. Cl.

| | |
|---|---|
| ***C25D 3/38*** | (2006.01) |
| ***C25D 7/06*** | (2006.01) |
| ***H01B 1/04*** | (2006.01) |
| ***H05K 3/18*** | (2006.01) |
| ***H05K 1/09*** | (2006.01) |
| ***C25D 15/00*** | (2006.01) |

(Continued)

(52) U.S. Cl.

CPC ............. *C25D 3/38* (2013.01); *C25D 7/0607* (2013.01); *C25D 15/00* (2013.01); *C25D 15/02* (2013.01); *H01B 1/04* (2013.01); *H05K 1/092* (2013.01); *H05K 3/188* (2013.01); *C25D 7/12* (2013.01); *H05K 1/028* (2013.01); *H05K 2201/0323* (2013.01); *H05K 2203/0723* (2013.01)

(58) Field of Classification Search

CPC .......... C25D 3/38; C25D 7/0607; C25D 7/12; C25D 15/00; C25D 15/02; H01B 1/04; H05K 1/028; H05K 1/092; H05K 3/188; H05K 2201/0323; H05K 2203/0723

See application file for complete search history.

(56) References Cited

U.S. PATENT DOCUMENTS

| | | | |
|---|---|---|---|
| 6,861,756 | B2 | 3/2005 | Saito et al. |
| 7,163,197 | B2 | 1/2007 | Yoshioka et al. |

(Continued)

FOREIGN PATENT DOCUMENTS

| | | | |
|---|---|---|---|
| JP | 1999135630 | A | 5/1999 |
| JP | 2000510289 | A | 8/2000 |

(Continued)

OTHER PUBLICATIONS

Alan Kleiman-Shwarsctein et al., "Low-Voltage Electrodeposition of Fullerol Thin Films from Aqueous Solutions", Journal of the electrochemical Society, May 5, 2006, pp. C483-C487, vol. 153 (7).

(Continued)

*Primary Examiner* — Nicholas A Smith
(74) *Attorney, Agent, or Firm* — Cantor Colburn LLP

(57) ABSTRACT

A plating solution including a metal salt, a hydrophilic fullerene, and water, a metal composite material including a hydrophilic fullerene and a method of manufacturing the same, and a wire, a flexible printed circuit (FPC), and an electronic device including the metal composite material.

6 Claims, 13 Drawing Sheets

(51) Int. Cl.

| | |
|---|---|
| ***C25D 15/02*** | (2006.01) |
| ***H05K 1/02*** | (2006.01) |
| ***C25D 7/12*** | (2006.01) |

(56) References Cited

U.S. PATENT DOCUMENTS

| | | | | |
|---|---|---|---|---|
| 7,247,946 B2 | 7/2007 | Bruley et al. | | |
| 7,332,810 B2 | 2/2008 | Awano | | |
| 7,387,957 B2 | 6/2008 | Saito et al. | | |
| 7,422,198 B2 | 9/2008 | Yoshioka et al. | | |
| 7,637,482 B2 | 12/2009 | Yoshioka et al. | | |
| 7,723,775 B2 | 5/2010 | Hwang et al. | | |
| 7,731,162 B2 | 6/2010 | Yoshioka et al. | | |
| 7,923,283 B2 | 4/2011 | Awano et al. | | |
| 7,990,051 B2 | 8/2011 | Koo | | |
| 8,273,290 B2 | 9/2012 | Kondoh et al. | | |
| 8,384,220 B2 | 2/2013 | Saito et al. | | |
| 2006/0024502 A1* | 2/2006 | McFarland | B82Y 40/00 | 428/408 |
| 2007/0281176 A1* | 12/2007 | Palumbo | C25D 7/00 | 428/457 |
| 2013/0228465 A1* | 9/2013 | Zhang-Beglinger | C25D 3/02 | 205/50 |
| 2016/0160055 A1* | 6/2016 | Wasserfallen | B05D 1/18 | 204/476 |
| 2016/0312011 A1* | 10/2016 | Kokubo | C09D 7/62 | |
| 2018/0346659 A1* | 12/2018 | Miller | A23L 33/16 | |

FOREIGN PATENT DOCUMENTS

| | | | |
|---|---|---|---|
| JP | 2001250824 | A | 9/2001 |
| JP | 2001337766 | A | 12/2001 |
| JP | 2002329723 | A | 11/2002 |
| JP | 2003158093 | A | 5/2003 |
| JP | 2005136433 | A | 5/2005 |
| JP | 2006203197 | A | 8/2006 |
| JP | 2008144208 | A | 6/2008 |
| JP | 2010206212 | A | 9/2010 |
| JP | 5184584 | B2 | 4/2013 |
| JP | 2013251380 | A | 12/2013 |
| JP | 5407867 | B2 | 2/2014 |
| KR | 0599053 | B1 | 7/2006 |
| KR | 20070053199 | A | 5/2007 |
| KR | 20080041954 | A | 5/2008 |
| KR | 20090065207 | A | 6/2009 |
| WO | 2010064732 | A1 | 6/2010 |

OTHER PUBLICATIONS

Chandramoulo Subramaniam et al., "One hundred fold increase in current carrying capacity in a carbon nanotube-copper composite", Nature Communications, Jul. 23, 2013, pp. 1-7, vol. 4:2202.

Hamed Asgharzadeh et al., "Metallurgical and Materials Transactions A—Physical Metallurgy and Materials Science", The Minerals, Metals & Materials Society and ASMInternational 2015, Feb. 18, 2015, pp. 1838-1842, vol. 46A.

International Technology Roadmap for semiconductors 2013 Edition, Published on Aug. 21, 2013, Chapter 3.

International Technology Roadmap for semiconductors 2013 Edition, Published on Aug. 21, 2013, Chapter 5.

Jeong Won Ko et al., "Preparation of [C60] Fullerene Nanoshisker-gold Nanoparticle Composites and Reduction of 4-Nirophenol through Catalysis", Nanomater Nanotechnol, Dec. 2015, pp. 1-8.

Katsuaki Kawasumi et al., "A grossly warped nanographene and the consequences of multiple odd-memberedring defects", Nature Chemistry, Jul. 14, 2013, pp. 739-744, vol. 5.

Large Scale Simulations on Nano-Carbon Material for Reducing Environmental Load, Nov. 7, 2013, Japan.

M. Reibold et al., "Carbon nanotubes in an ancient Damascus sabre", Nature, Nov. 16, 2003, p. 286, vol. 444.

Masatsugu Fujishige et al., "Electric Contact Characteristic under Low Load of Silver-Carbon Nanotube Composite Plating Film Corroded Using H2S Gas", Applied Physics Express 3, May 28, 2010, pp. 1-3, vol. 065801.

P.M. Vereechen et al., "The chemistry of additives in damascene copper plating", IBM J. Res. & Dev., Dec. 7, 2004, pp. 1-16, vol. 49, No. 1.

Radovan Kukobat et al., "Sol-gel chemistry mediated Zn/Al-based complex dispersant for SWCNT in water without foam formation", Carbon, Jul. 7, 2015, pp. 518-523, vol. 94.

* cited by examiner

PLATING SOLUTION AND METAL COMPOSITE AND METHOD OF MANUFACTURING THE SAME

CROSS-REFERENCE TO RELATED APPLICATION

This application claims priority to and the benefit of Korean Patent Application No. 10-2018-0009925 filed in the Korean Intellectual Property Office on Jan. 26, 2018, and all the benefits accruing therefrom under 35 U.S.C. § 119, the entire content of which is incorporated herein by reference.

BACKGROUND

1. Field

A plating solution, a metal composite material, and a method of manufacturing the same are disclosed.

2. Description of the Related Art

Recently, research on a material and a method of forming a fine metal line has been made in accordance with reductions in sizes of electronic devices and thereby, miniaturizing an integrated circuit. A method of forming the fine metal line may for example include a method of filling a metal in a groove such as a via and a trench through an electrodeposition such as electroplating a metal.

However, as ampacity, i.e., ampere capacity, of a metal line reaches a limit according to development of information technology (IT), development of a wire material having high ampacity is required. Herein, ampacity is defined as an amount of current at which resistivity does not change but as the current increases beyond the ampacity, the resistivity increases.

SUMMARY

An embodiment provides a plating solution contributing to forming a fine pattern as well as improving ampacity.

An embodiment provides a metal composite material contributing to forming a fine pattern as well as improving ampacity.

In addition, an embodiment provides a method of forming the metal composite material.

Furthermore, an embodiment provides a wire, a flexible printed circuit (FPC), and an electronic device which include the metal composite material.

According to an embodiment, the plating solution includes a metal salt, a hydrophilic fullerene, and water.

The hydrophilic fullerene may include a hydrophilic functional group bound to a fullerene core. The functional group may include a hydroxyl group, an amino group, a carbonyl group, a carboxyl group, a sulfhydryl group, a phosphate group, or a combination thereof.

The hydrophilic fullerene may include an average of 2 to 44 functional groups bound to the fullerene core.

The hydrophilic fullerene may include an average of 12 to 44 functional groups bound to the fullerene core.

The hydrophilic fullerene may be represented by $C_x(OH)_y$ (wherein, x is 60, 70, 74, 76, or 78 and the average value of y is 2 to 44).

The metal salt may be selected from a copper salt, a silver salt, a gold salt, an aluminum salt, a calcium salt, a zinc salt, a tungsten salt, an iron salt, a tin salt, a platinum salt, a nickel salt, or a combination thereof.

A metal-fullerene composite that is a reaction product of a metal cation of the metal salt and the hydrophilic fullerene may be further included.

The plating solution may have pH of 3.5 or less.

The hydrophilic fullerene may be present in an amount of about 10 to about 100 parts by weight based on 100 parts by weight of the metal salt.

According to an embodiment, a metal composite material including a metal and a hydrophilic fullerene is provided.

The hydrophilic fullerene may be chemically bonded with the metal.

The metal may include copper, silver, gold, aluminum, calcium, zinc, tungsten, iron, tin, platinum, nickel, or a combination thereof.

According to an embodiment, a wire includes the metal composite material.

According to an embodiment, a flexible printed circuit (FPC) includes the wire.

According to an embodiment, an electronic device includes the wire.

According to an embodiment, an electronic device includes the flexible printed circuit (FPC).

According to an embodiment, a method of forming a metal composite material includes preparing the plating solution, disposing a substrate including a metal layer or a metal plate and an opposed electrode in the plating solution, and plating a metal composite material including a hydrophilic fullerene on the metal layer or the metal plate by flowing a current between the metal layer or the metal plate and the opposed electrode to form the metal composite material.

The plating of the metal composite material may be performed at current density of about 0.1 to about 1.0 amperes per square meter ($A/m^2$).

Current capacity, conductivity, and electrical stability may not only be improved, but a fine pattern may also be effectively formed.

DETAILED DESCRIPTION

Figure 1:
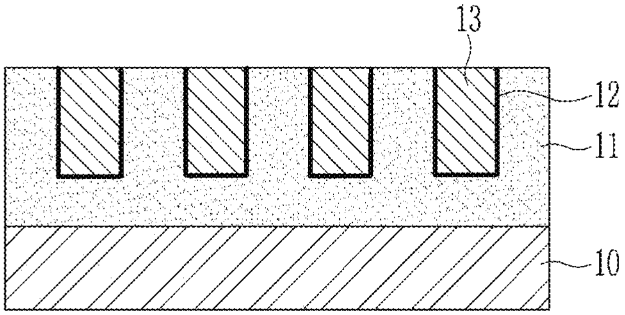
FIG. 1 is a schematic view partially showing a flexible printed circuit (FPC) including a metal composite material according to an embodiment.

Example embodiments of the present disclosure will hereinafter be described in detail, and may be easily performed by a person having an ordinary skill in the related art. However, actually applied structures may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a plating solution according to an embodiment is described.

A plating solution according to an embodiment includes a metal salt and a hydrophilic fullerene.

The metal salt is a compound including, e.g., consisting of, metal cations and anions, and may be reduced to a low resistance metal, for example, a metal having conductivity of greater than or equal to about $1\times10^7$ siemens per meter (S/m).

The metal salt may be for example a copper salt, a tungsten salt, an iron salt, a tin salt, a platinum salt, a nickel salt, or a combination thereof, but is not limited thereto. For example, the metal salt may be a copper salt, for example copper sulfate ($CuSO_4.5H_2O$), copper acetate ($Cu(CH_3COO)_2.H_2O$), copper nitrate ($Cu(NO_3)_2$), copper formate ($Cu(HCOO)_2$), copper chloride ($CuCl_2.H_2O$), copper cyanide (CuCN), or a combination thereof, but is not limited thereto.

The metal salt may be included in an amount supplying metal cations in a sufficient amount for electroplating, for example, in an amount of about 0.05 weight percent (wt %) to about 1 wt % based on that of a plating solution. Within the range, the metal salt may be included in an amount of about 0.07 wt % to about 0.8 wt %, about 0.1 wt % to about 0.5 wt %, or about 0.1 wt % to about 0.3 wt %.

The hydrophilic fullerene may be a compound including a hydrophilic functional group bound to the fullerene core.

The fullerene core in general may be hydrophobic but is linked with a hydrophilic functional group and thus may become hydrophilic. The fullerene core may be for example C60, C70, C74, C76, or C78 but is not limited thereto.

The hydrophilic functional group may be for example a hydroxyl group, an amino group, a carbonyl group, a carboxyl group, sulfhydryl group, a phosphate group, or a combination thereof, but is not limited thereto.

The hydrophilic fullerene may include an average of greater than or equal to about two hydrophilic functional groups per one fullerene core, for example an average of about 2 to about 44 hydrophilic functional groups, for example, an average of about 8 to about 44 hydrophilic functional groups, for example, an average of about 12 to about 44 hydrophilic functional groups, for example, an average of about 24 to about 44 hydrophilic functional groups, for example, an average of about 24 to about 40 hydrophilic functional groups, and for example an average of about 24 to about 36 hydrophilic functional groups.

For example, the hydrophilic fullerene may be a hydroxyl fullerene and may be, for example represented by $C_x(OH)_y$ (wherein, x is 60, 70, 74, 76, or 78, and an average value of y is about 2 to about 44).

The hydrophilic fullerene may be included in an amount of about 10 to about 100 parts by weight based on 100 parts by weight of the metal salt. Within the range, it may be included in an amount of about 15 to about 100 parts by weight, for example about 15 to about 80 parts by weight, about 15 to about 70 parts by weight, about 15 to about 60 parts by weight, about 15 to about 50 parts by weight, about 15 to about 40 parts by weight, or about 15 to about 30 parts by weight.

The plating solution may further include a metal-fullerene composite of a metal cation of the metal salt and the hydrophilic fullerene. The metal-fullerene composite is a reaction product obtained through a reaction of a metal cation of the metal salt and a functional group of the hydrophilic fullerene in the plating solution, and the metal cation and the hydrophilic fullerene may have a chemical bond, e.g., the metal cation and the hydrophilic fullerene may be chemical bonded to one another. The reaction may be for example performed by mixing the metal salt and the hydrophilic fullerene, for example, at room temperature (about 25° C.).

For example, when the metal is expressed by M and an example of the hydrophilic fullerene is a hydroxyl fullerene represented by $C_x(OH)_y$, the metal-fullerene composite may be for example represented by Chemical Formula A or B.

Chemical Formula A

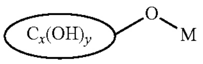

Chemical Formula B

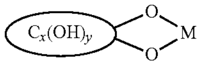

In Chemical Formula A or B, x is 60, 70, 74, 76, or 78, and an average value of y is about 2 to about 44.

For example, the plating solution including a metal-fullerene composite may have a different color from a plating solution including a metal salt, for example, a plating solution including a copper salt may be blue, but a plating solution including a copper-fullerene composite may be blackish brown or black.

A particle diameter of the metal-fullerene composite may be measured through dynamic light scattering (DLS) and, for example, less than or equal to about 10 nanometers (nm), less than or equal to about 8 nm, less than or equal to about 7 nm, or less than or equal to about 5 nm. The particle diameter of the metal-fullerene composite may be, for example, about 1 nm to about 10 nm, about 1 nm to about 8 nm, about 1 nm to about 7 nm, or about 1 nm to about 5 nm.

The plating solution may further include acid. The acid may be for example sulfuric acid ($H_2SO_4$), hydrochloric acid (HCl), acetic acid ($CH_3COOH$), fluoroboric acid ($HBF_4$), a C1-C6 alkyl)sulfonic acid, a C6-C18 aryl)sulfonic acid, phosphoric acid, or a combination thereof, but is not limited thereto.

The acid may be included in an amount of about 0.01 to about 10 wt % based on the plating solution. Within the range, it may be included in an amount of about 0.01 to about 8 wt %, about 0.01 to about 7 wt %, about 0.01 to about 5 wt %, or about 0.01 to about 3 wt %.

The plating solution may include for example a leveler, a suppressor, a promoter (catalyst), a gloss auxiliary agent (brightener), a reducing agent, and/or various additives.

The leveler may include polyethylene imine or a derivative thereof, quaternized polyethylene imine, polyglycine, poly(allylamine), polyaniline, polyurea, polyacrylamide, poly(melamine-co-formaldehyde), a reaction product of an amine and epichlorohydrin, a reaction product of an amine, epichlorohydrin, and polyalkylene oxide, a reaction product of an amine, polyepoxide, polyvinylpyridine, polyvinylimidazole, polyvinylpyrrolidone, or a copolymer thereof, nigrosine, pentamethyl-para-rosaniline hydrohalide, hexamethyl-para-rosaniline hydrohalide, trialkanolamine or a derivative thereof, a compound having a functional group of Chemical Formula N—R—S (wherein, R is substituted alkyl, unsubstituted alkyl, substituted aryl, or unsubstituted aryl), or a combination thereof, but is not limited thereto.

The suppressor may be for example a polymeric material, for example, a polyethylene glycol copolymer and/or a polyethylene glycol polypropylene glycol copolymer, but is not limited thereto.

The promoter may include a sulfur-containing compound, sulfonic acid, phosphonic acid, or a salt thereof, but is not limited thereto.

The components are independently included, for example, in a small amount of about 1 parts per million (ppm) to about 100,000 ppm.

The plating solution may further include a solvent capable of dissolving or dispersing the aforementioned components, and the solvent may be, for example, water. The water may be any water such as distilled water and/or deionized water.

The plating solution may be acidic and, for example, has a pH of 3.5 or less and thus strongly acidic. The plating solution may have, for example, a pH of 3.0 or less, for example, a pH of 2.5 or less, or, for example, a pH of 2.0 or less.

The aforementioned plating solution may be formed into a metal composite material through electroplating.

The metal composite material may have a structure including a hydrophilic fullerene in a metal matrix, and herein, the hydrophilic fullerene may have a chemical bond with a metal, e.g., the hydrophilic fullerene may be chemical bonded to a metal. As described above, the metal may be, for example, copper, silver, gold, aluminum, calcium, zinc, tungsten, iron, tin, platinum, nickel, or a combination thereof, but is not limited thereto.

In the metal composite material, an amount of the hydrophilic fullerene may be adjusted depending on a plating solution and a plating condition and, for example, the amount of the hydrophilic fullerene may be increased, as pH of the plating solution is increased, for example, as current density of plating is increased.

The metal composite material may be effectively suppressed from electromigration, compared with a pure metal including no hydrophilic fullerene. Electromigration denotes a phenomenon that metal atoms are diffused in one direction along with motion of electrons and may cause a void and thus a short circuit. Without being bound by any particular theory, the metal composite material is suppressed from migration of metal atoms due to generation of a relatively strong electronic interaction between a hydrophilic fullerene and a metal, and on the other hand, the fullerene having a stable structure absorbs vibration energy generated by heat or a current and reduces vibration of the metal atoms and thus suppresses electromigration.

The metal composite material may have greater ampacity than that of a pure metal including no hydrophilic fullerene. The ampacity denotes maximum current-carrying capacity, and the metal composite material has greater current-transport capability than that of the pure metal. The metal composite material may have, for example, greater than or equal to about 1.5 times or for example, greater than or equal to about twice an ampacity of the pure metal.

In this way, the metal composite material may have equivalent or greater ampacity than that of the pure metal including no hydrophilic fullerene. For example, the metal composite material may have greater than or equal to about 1.5 times a maximum current-carrying capacity of the pure metal.

As described above, the metal composite material may be formed by using a plating solution including a hydrophilic fullerene, and during the plating, a spherical hydrophilic fullerene and/or a metal-fullerene composite having a diameter of less than or equal to a nanometer may effectively go in and fill a groove of a fine line width. Accordingly, a wire having a fine line width without a void may be effectively formed.

The metal composite material may be used as a wire, and the wire may be, for example, included in a flexible printed circuit (FPC). The metal composite material may be effectively used for a wire having a fine line width, for example, a fine wire having a pitch of less than or equal to about 20 nm.

The wire and/or flexible printed circuit (FPC) may be included in various electronic devices such as a semiconductor device, a display device, and the like.

FIG. 1 is a schematic view showing a part of a flexible printed circuit (FPC) including the metal composite material according to an embodiment.

Referring to FIG. 1, the flexible printed circuit (FPC) includes a substrate 10, an insulation layer 11, a conductive layer 12, and a plating layer 13.

The substrate 10 may be an insulation substrate, a metal plate, or a silicon wafer, but is not limited thereto.

The insulation layer 11 may include for example an inorganic material such as a $SiO_2$-based insulating material such as tetraethoxysilane and the like, a SiOF-based insulating material, and a SiOC-based insulating material; an organic/inorganic material such as a hydrogen-containing polysiloxane-based insulating material and a methyl-containing polysiloxane-based insulating material; an organic material such as a polyimide-based insulating material, parylene, and Teflon; an air gap, and the like but is not limited thereto. The insulation layer 11 may have an alternatively embossed and depressed pattern.

The conductive layer 12 is formed to be thin along the surface of the insulation layer 11 and may be a diffusion barrier or an electricity-feeding layer. The conductive layer 12 may, for example, include Ta, TaN, or a combination thereof but is not limited thereto.

The plating layer 13 may be charged in a depressed region, that is, a groove of the insulation layer 11 and include the above metal composite material and be formed through electroplating.

FIGS. 2 to 6 are schematic views showing a method of manufacturing the flexible printed circuit (FPC) of FIG. 1.

Figure 2:
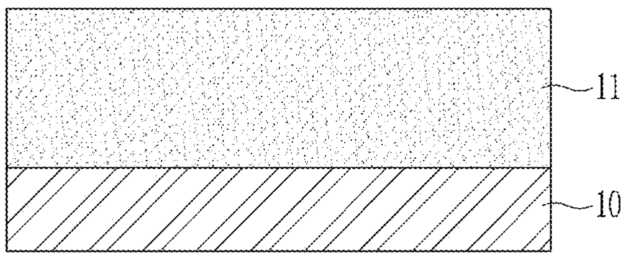
FIGS. 2 to 6 are schematic views showing a method of manufacturing the flexible printed circuit (FPC) of FIG. 1.

Referring to FIG. 2, the insulation layer 11 is formed on the substrate 10. The insulation layer 11 may be, for example, formed in a deposition method such as chemical vapor deposition (CVD) or in a solution process such as spin coating but is not limited thereto.

Figure 3:
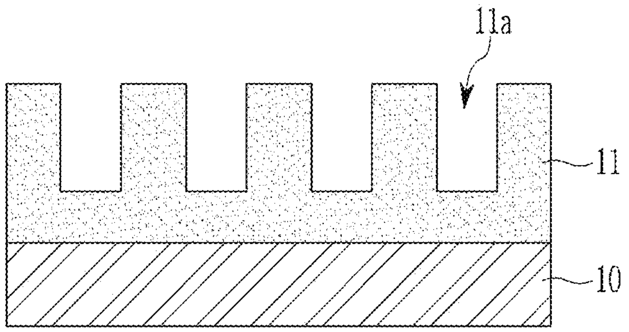

Referring to FIG. 3, a plurality of grooves 11*a* is formed in the insulation layer 11. The grooves 11*a* may have a line width of less than or equal to about 20 nm. The grooves 11*a* may be formed through photolithography but is not limited thereto.

Figure 4:
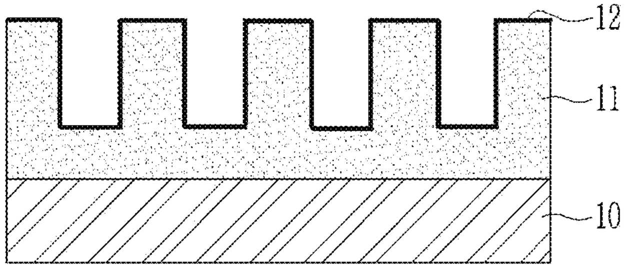

Referring to FIG. 4, the conductive layer 12 is formed on the insulation layer 11 having the grooves 11*a*. The conductive layer 12 may be, for example, formed through a physical vapor deposition such as sputtering but is not limited thereto.

Figure 5:
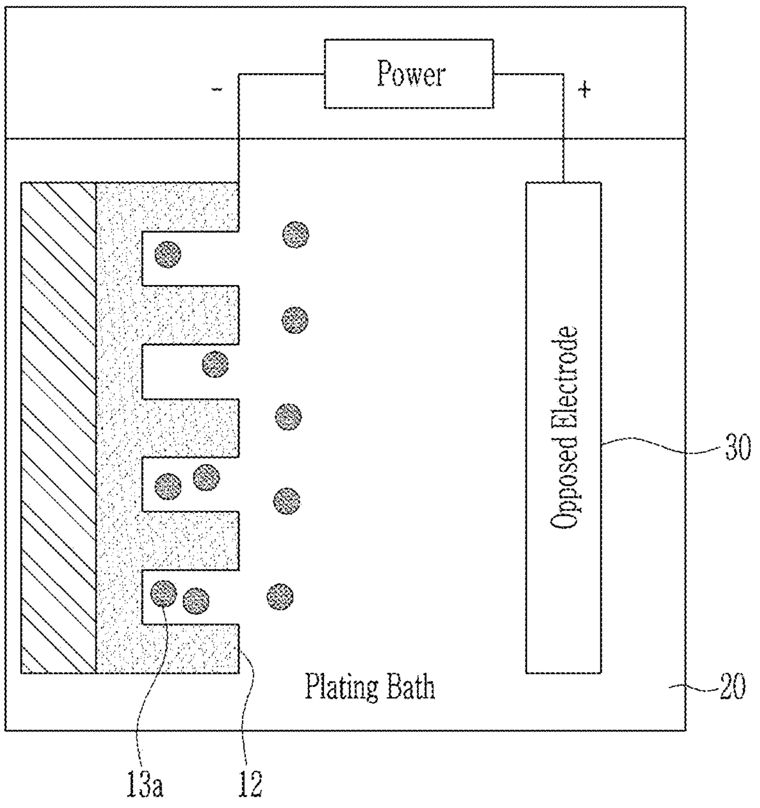

Referring to FIG. 5, the substrate 10 and the opposed, e.g., opposing, electrode 30 are disposed in the plating solution 20, and electroplating is performed by flowing a current between the conductive layer 12 and an opposed electrode 30. Herein, current density may be about 0.1 to about 1.0 $A/m^2$ but is not limited thereto.

Herein, a spherical hydrophilic fullerene and/or a metal-fullerene composite 13*a* having a diameter of less than or equal to several nanometers effectively goes in the fine grooves 11*a* having a line width of less than or equal to about 20 nm and charge the grooves 11*a* and thus may effectively form a metal line having a fine line width.

Figure 6:
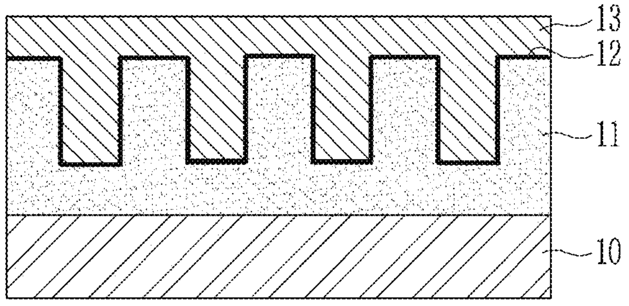

Referring to FIG. 6, the plating layer 13 is formed on the conductive layer 12.

Referring to FIG. 1, the plating layer 13 is formed by planarizing the plating layer 30 and filling it in the grooves 11*a*.

Hereinafter, the embodiments are illustrated in more detail with reference to examples. However, these examples are exemplary, and the present disclosure is not limited thereto.

SYNTHESIS EXAMPLE 10 grams (g) of a hydroxyl fullerene precursor ($C_{60}(OH)_{6-12}$, Nanom Spectra D100, Frontier Carbon Corp.) is dispersed in a 30% hydrogen peroxide solution and then, stirred at 60° C. for 48 hours in a flask to synthesize a hydroxyl fullerene represented by Chemical Formula 1 ($C_{60}(OH)_{24-36}$, Peak: $C_{60}(OH)_{31}$. In $C_{60}(OH)_n$(Peak), n denotes the number of OH at a maximum peak on a mass spectrum (LCMS) of FIGS. 7 and 8 and is marked as an integral by rounding off to the nearest whole number.

When measured in a dynamic light scattering method (SUPTEK Yag Keceleri San. ve Tic. A.S.), the hydroxyl fullerenes have an average particle diameter of about 1 nanometer (nm).

Chemical Formula 1

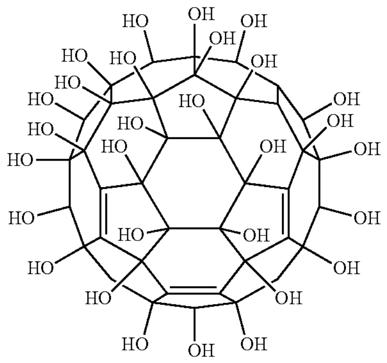

Preparation of Plating Solution

PREPARATION EXAMPLES AND COMPARATIVE PREPARATION EXAMPLE

As shown in Table 1, each plating solution of Preparation Examples 1-3 and Comparative Example 1 is prepared. When the plating solution is prepared, the components other than hydroxyl fullerene and $H_2SO_4$ are first mixed and then, mixed with the hydroxyl fullerene and $H_2SO_4$.

TABLE 1

| | Preparation Example 1 | Preparation Example 2 | Preparation Example 3 | Comparative Preparation Example 1 |
|---|---|---|---|---|
| Hydroxyl fullerene ($C_{60}(OH)_{24-36}$, Peak: $C_{60}(OH)_{31}$ | 19.5 grams per liter (g/L) | 19.5 g/L | 19.5 g/L | — |
| $C_{60}(OH)_{6-12}$ | — | — | — | — |
| $C_{60}$ | — | — | — | — |
| polyacrylic acid | 1 g/L | 1 g/L | 1 g/L | 1 g/L |
| $CuSO_4 \cdot 5H_2O$ | 60 g/L | 60 g/L | 60 g/L | 60 g/L |
| $H_2SO_4$ | 0 | 0 | 0 | 182 g/L |
| NaCl | 0.08 g/L | 0.08 g/L | 0.08 g/L | 0.08 g/L |
| SPS | 0.002 g/L | 0.002 g/L | 0.002 g/L | 0.002 g/L |

TABLE 1-continued

| | Preparation Example 1 | Preparation Example 2 | Preparation Example 3 | Comparative Preparation Example 1 |
|---|---|---|---|---|
| JGB | 0.01 g/L | 0.01 g/L | 0.01 g/L | 0.01 g/L |
| pH | 0.0 | 1.0 | 2.0 | 0.0 |

* $C_{60}(OH)_{6-12}$, Nanom Spectra D100, Frontier Carbon Corp.
* C60: NANOM SPECTRA D100: Frontier Carbon Corp.
* polyacrylic acid: Wako Pure Chemical Industries, Ltd.
* $CuSO_4{\bullet}5H_2O$: Kanto Chemical Co., Inc.
* SPS: 3,3'-dithiobis(1-propanesulfonic acid) disodium: Tokyo Chemical Industry Co., Ltd.
* JGB: Janus Green B: Tokyo Chemical Industry Co., Ltd.
* pH: pH Meter SP-2100 (Yag Keceleri San. ve Tic. A.S.)

Preparation of Metal Composite Material

EXAMPLE

Each of Ru/Ta is subsequently coated with a thickness of 10 nm on a silicon wafer, the silicon wafer (a cathode) and an opposed electrode (a positive electrode) are disposed to face each other in the plating solution according to Preparation Example 3, and then, the plating solution is stirred at 20° C. While the plating solution is stirred, the positive electrode and the cathode are connected to power and then, plated by flowing a current with various average current densities (0.1 amperes per square decimeter ($A/dm^2$) to about 1.0 $A/dm^2$) for 45 minutes. The obtained Cu plating layer (including a metal composite material) has a thickness of 1 micrometer (μm).

COMPARATIVE EXAMPLE

A pure Cu plating layer is obtained according to the same method as Example except for using the plating solution according to Comparative Preparation Example 1 instead of the plating solution according to Preparation Example 3.

Evaluation I Whether or not hydroxyl fullerene is included in the Cu plating layer of the Example is evaluated.

The evaluation is performed through a mass spectrum.

Figure 7:
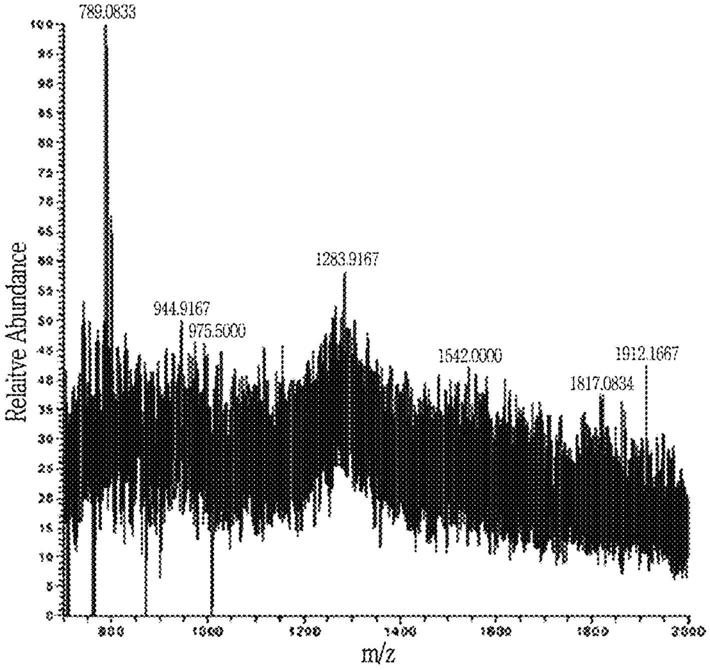
FIG. 7 is a mass spectrum of a copper-fullerene composite of Example 1.
Figure 8:
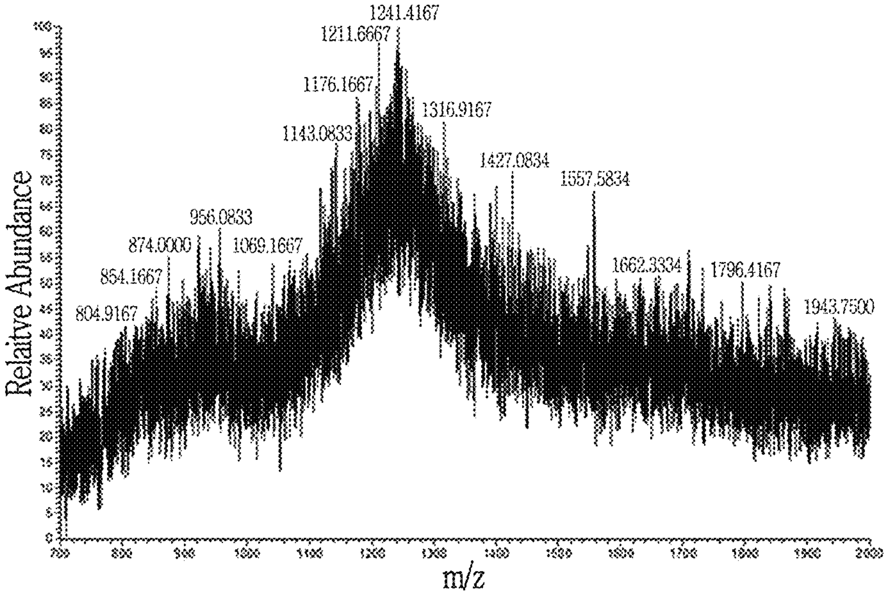
FIG. 8 is a mass spectrum of a hydroxyl fullerene of the Synthesis Example.

FIG. 7 shows a mass spectrum of the copper-fullerene composite of the Example, and FIG. 8 shows a mass spectrum of the hydroxyl fullerene of the Synthesis Example.

Comparing these two mass spectra of FIG. 7 and FIG. 8, main peaks are overlapped, and the copper-fullerene composite of the Example includes hydroxyl fullerene.

Evaluation II

A content of fullerene (C60) and a hydroxyl group (OH) present in the Cu plating layer (including a metal composite material) of the Example depending on current density is examined.

Figure 9:
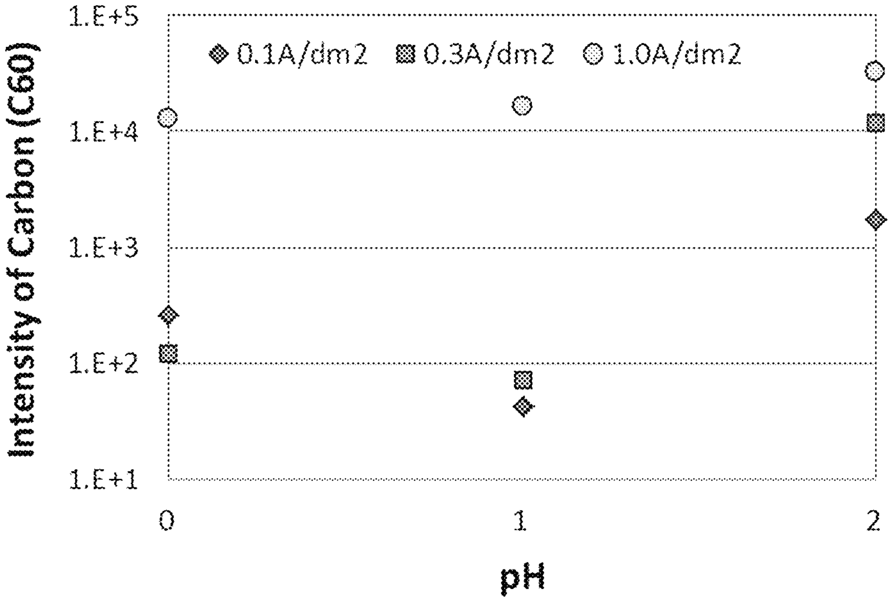
FIG. 9 is a graph showing a content of fullerene (C60) included in a Cu plating layer of the Example depending on current density.
Figure 10:
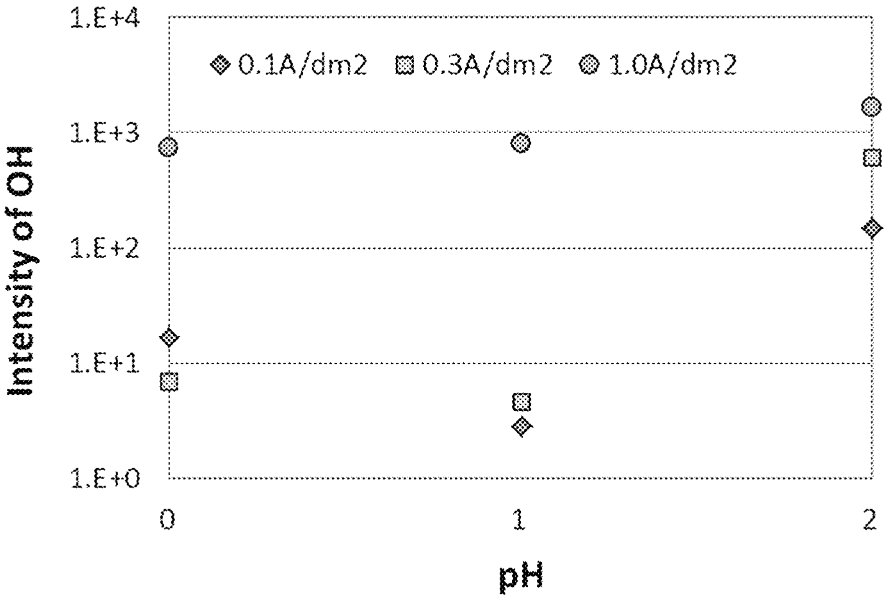
FIG. 10 is a graph showing a content of a hydroxyl group (OH) included in the Cu plating layer of the Example depending on current density.

FIG. 9 is a graph showing a content of the fullerene (C60) of the Cu plating layer of the Example depending on a current density, and FIG. 10 is a graph showing a content of hydroxyl group (OH) of the Cu plating layer of the Example depending on a current density.

Referring to FIGS. 9 and 10, contents of the fullerene (C60) and a hydroxyl group (OH) in the Cu plating layer vary depending on pH and a current density, for example, as the pH is increased, the contents of the fullerene (C60) and the hydroxyl group (OH) are increased in the Cu plating layer, and as the current density is increased, the contents of the fullerene (C60) and the hydroxyl group (OH) are increased in the Cu plating layer.

Accordingly, the contents of the fullerene and the hydroxy group in the Cu plating layer may be adjusted by controlling a condition of the plating.

Evaluation III

A resistivity change of the Cu plating layers according to the Example and the Comparative Example depending on a current density is examined.

Figure 11:
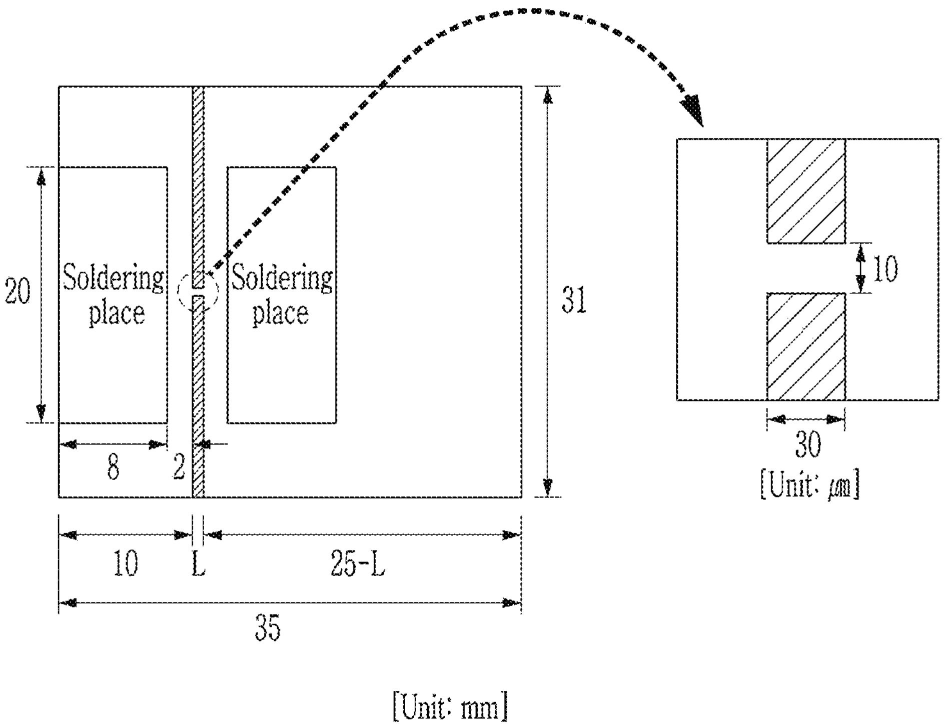
FIG. 11 is a schematic view showing a sample for measuring a resistivity change of each Cu plating of the Example and the Comparative Example depending on current density.

The resistivity change depending on a current density is measured with N5765A made by Agilent Technologies after forming each wire (a length: 30 μm, a width: 10 μm) by using the Cu plating layers of the Example and the Comparative Example as shown in FIG. 11.

Figure 12:
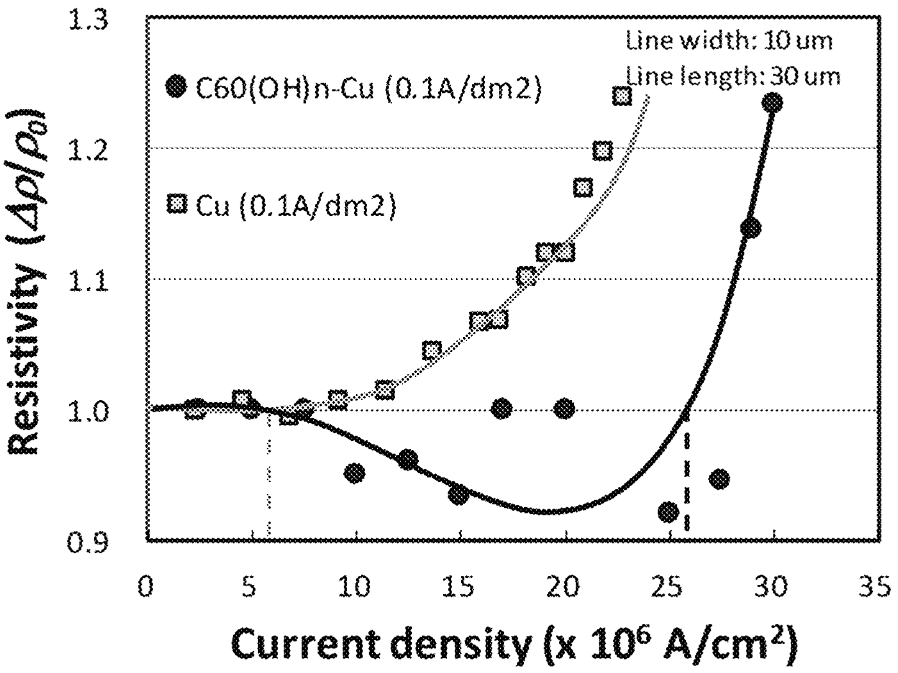
FIG. 12 is a graph showing a resistivity change of each Cu plating layer plated at current density of 0.1 $A/m^2$ of the Example and the Comparative Example depending on current density.
Figure 13:
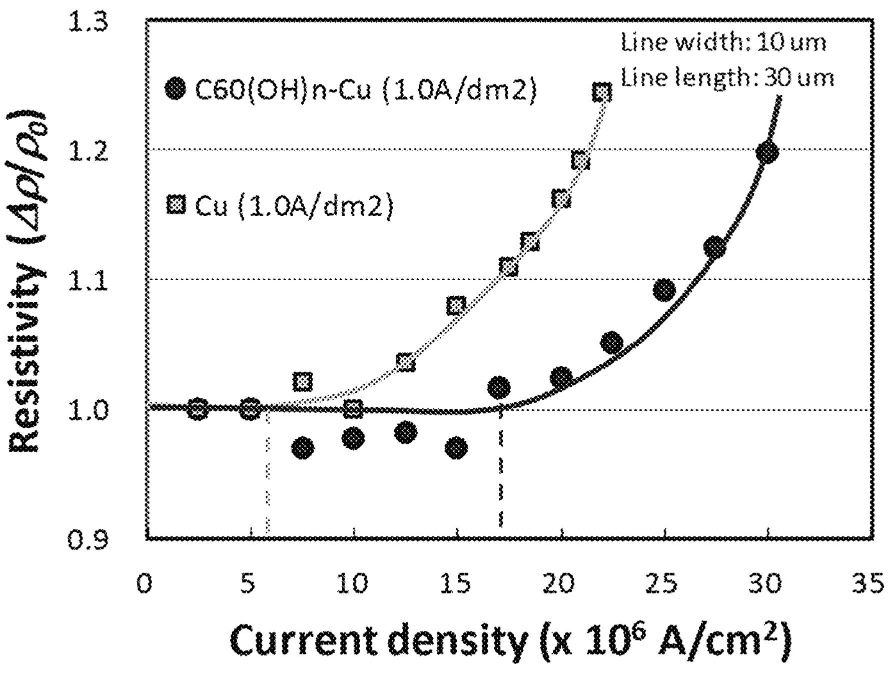
FIG. 13 is a graph showing a resistivity change of each Cu plating layer plated at current density of 1.0 $A/m^2$ of the Example and the Comparative Example depending on current density.

The results are shown in FIGS. 12 and 13.

FIG. 12 is a graph showing a resistivity change of the Cu plating layers plated at a current density of 0.1 $A/m^2$ of the Example and the Comparative Example, and FIG. 13 is a graph showing a resistivity change of the Cu plating layers plated at a current density of 1.0 $A/m^2$ of the Example and the Comparative Example.

Referring to FIGS. 12 and 13, the Cu plating layer of the Example shows a small resistivity change compared with that of the Cu plating layer of the Comparative Example. Accordingly, the Cu plating layer of the Example shows high electrical stability compared with that of the Cu plating layer of the Comparative Example.

Evaluation IV

Referring to FIGS. 12 and 13, ampacity of the Cu plating layers of the Example and the Comparative Example is examined.

The ampacity is defined as a current capacity having resistivity ($Dr/r_0$) of greater than 1 and the resistivity increases as the current increases beyond the ampacity.

The results are shown in Tables 2 and 3.

TABLE 2

| | Ampacity (milliamperes per square centimeter ($mA/cm^2$)) @ 0.1 $A/dm^2$ |
|---|---|
| Example | 17 |
| Comparative Example | 6.0 |

TABLE 3

| | Ampacity ($MA/cm^2$) @ 1.0 $A/dm^2$ |
|---|---|
| Example | 26.0 |
| Comparative Example | 6.0 |

Referring to Tables 2 and 3, the Cu plating layer of the Example shows greater, for example, twice, an ampacity of the Comparative Example.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A plating solution comprising a metal salt, a hydrophilic fullerene, and water, and a metal-fullerene composite that is a reaction product of the metal salt and the hydrophilic fullerene represented by $C_x(OH)_y$, wherein x is 60, 70, 74, 76, or 78, and an average value of y is about 2 to about 44, a particle diameter of the metal-fullerene composite measured through dynamic light scattering being less than or equal to about 10 nanometers.

2. The plating solution of claim 1, wherein the plating solution has a pH of 3.5 or less.

3. The plating solution of claim 1, wherein the hydrophilic fullerene is present in an amount of about 10 to about 100 parts by weight based on 100 parts by weight of the metal salt.

4. The plating solution of claim 1, wherein the hydrophilic fullerene represented by $C_x(OH)_y$, wherein x is 60, 70, 74, 76, or 78, and the average value of y is about 2 to about 44 is chemically bonded with a metal cation of the metal salt in the metal-fullerene composite.

5. A method of forming a metal composite material comprising preparing the plating solution of claim 1, disposing a substrate comprising a metal layer or a metal plate and an opposed electrode in the plating solution, and plating a metal composite material comprising a hydrophilic fullerene on the metal layer or the metal plate by flowing a current between the metal layer or the metal plate and the opposed electrode to form the metal composite material.

6. The method of claim 5, wherein the plating of the metal composite material is performed at a current density ranging from about 0.1 amperes per square meter to about 1.0 amperes per square meter.

* * * * *